United States Patent [19]

Moslehi

[11] Patent Number: 5,322,809
[45] Date of Patent: Jun. 21, 1994

[54] SELF-ALIGNED SILICIDE PROCESS

[75] Inventor: Mehrdad Moslehi, Dallas, Tex.

[73] Assignee: Texas Instruments Incorporated, Dallas, Tex.

[21] Appl. No.: 60,774

[22] Filed: May 11, 1993

[51] Int. Cl.⁵ .................. H01L 21/336; H01L 21/283
[52] U.S. Cl. .......................... 437/41; 437/44; 437/190; 437/200; 437/242; 748/DIG. 19; 748/DIG. 147
[58] Field of Search .............. 437/200, 41, 190, 241, 437/242, 44; 748/DIG. 19, DIG. 147; 257/382, 383, 763, 768, 770

[56] References Cited

U.S. PATENT DOCUMENTS

| | | | |
|---|---|---|---|
| 4,402,997 | 9/1983 | Hogan et al. | 437/242 |
| 4,551,908 | 11/1985 | Nagasawa et al. | 437/203 |
| 4,587,718 | 5/1986 | Haken et al. | 437/200 |
| 4,740,484 | 4/1988 | Norström et al. | 437/200 |
| 4,755,478 | 7/1988 | Abernathey et al. | 437/41 |
| 4,784,973 | 11/1988 | Stevens et al. | 437/200 |
| 4,877,755 | 10/1989 | Rodder | 437/200 |
| 4,880,753 | 11/1989 | Meakin et al. | 437/41 |
| 4,897,287 | 1/1990 | Berger et al. | 437/200 |
| 5,032,545 | 7/1991 | Doan et al. | 437/242 |
| 5,034,348 | 7/1991 | Hartswick et al. | 437/200 |
| 5,081,065 | 1/1992 | Jonkers et al. | 437/200 |
| 5,086,017 | 2/1992 | Lu | 437/200 |
| 5,103,272 | 4/1992 | Nishiyama | 257/770 |

FOREIGN PATENT DOCUMENTS 63-62379 3/1988 Japan .

OTHER PUBLICATIONS

"Dual Self-Aligned Silicides on FET Gates and Junctions", *IBM Tech. Disc. Bull.*, vol. 31, No. 7, Dec. 1988, p. 154.

*Primary Examiner*—T. N. Quach
*Attorney, Agent, or Firm*—Jacqueline J. Garner; Richard L. Donaldson; William Hiller

[57] ABSTRACT

A self-aligned silicide process that enables different silicide thicknesses for polysilicon gates and source-/drain junction regions. Semiconductor body (10) includes a doped well (14) formed in substrate (12). Field insulating region (18) is located above channel stop region (16) in doped well (14). Implanted within doped well (14) are source/drain junctions (34). Source/drain junctions (34) are shallow heavily doped regions. The surfaces of source/drain junctions (34) are silicided. Silicide gate (44) is separated from the surface of doped well (14) by gate insulator layer (20) and contains a silicide layer (40) and a doped polysilicon layer (22). The thickness of silicide layer (40) is not limited by the thickness of the silicided surfaces of source/drain junctions (34) or the amount of silicon consumed over these junctions. Silicon nitride sidewall spacers (32) separate the sidewall edges of silicide gate (44) and the transistor channel region from the source/drain junction silicide layer 41.

15 Claims, 6 Drawing Sheets

SELF-ALIGNED SILICIDE PROCESS

FIELD OF THE INVENTION

This invention generally relates to semiconductor device fabrication technologies and more specifically to self-aligned silicide processes.

BACKGROUND OF THE INVENTION

As the demand for more complex functions and higher performance in integrated circuits increases, it becomes necessary to reduce parasitic resistance elements of device structures as much as possible. One method which has been developed to reduce parasitic resistance values involves self-aligned silicide device structures. The conventional self-aligned silicide device structures include low resistance silicide layers formed over source/drain junctions regions and insulated polysilicon gate regions. Typically, a layer of refractory metal such as titanium is deposited and reacted in a nitrogen atmosphere. Titanium reacts with nitrogen to form a layer of titanium-nitride (TiN). Moreover, over exposed silicon areas, titanium reacts with and consumes silicon to form a layer of silicide (TiSix). The layer of TiN is removed selectively leaving silicided polysilicon gates and silicided source/drain junctions with reduced parasitic resistance elements.

Silicide has a much lower sheet resistance than doped polysilicon normally used to form the transistor gate regions. As a result, when the gate regions are silicided, the silicide shunts the higher resistance polysilicon. Accordingly, the silicided gate structures reduce the parasitic gate resistance and gate propagation delay due to this silicide electrical shunting effect. Moreover, the silicided source/drain junctions also have smaller parasitic resistance values and, as a result, provide larger extrinsic device transconductance values due to reduced series resistance. As the technologies scale below 0.5 micron features, the source/drain junctions become shallower to reduce the short channel effects, such as drain induced barrier lowering (DIBL) and punch-through leakage. This places a constraint on the amount of silicon consumption that can be tolerated due to the silicidation of the source/drain junction regions. This, in turn, places a constraint on the minimum allowable junction depth.

Prior art self-aligned silicide (SALICIDE) processes and silicided contact processes control the junction leakage by reducing the initial deposited refractory metal thickness. However, reducing the initial refractory metal thickness can result in excessive parasitic source/drain resistance values and transconductance degradation. Some alternative technologies have used an oxide layer between the initial titanium and silicon prior to the react process in order to improve the Ti-Si2/Si interface roughness. However, this approach has the drawback that it introduces oxygen in the silicide films. This is undesirable because it increases the resistivity of the silicide. Moreover, this method does not resolve the excessive silicon consumption problem when a sufficiently thick silicide layer is required for high-performance technologies.

SUMMARY OF THE INVENTION

Generally, and in one form of the invention, a self-aligned silicide process that enables different thicknesses of silicide over source/drain junction regions and gate regions is disclosed. A thin nitride layer is formed over the source/drain regions. Next, a layer of refractory metal is deposited over the thin nitride layer and the gate regions. Finally, the layer of refractory metal is annealed to form a first silicide layer over the gate regions and a second silicide layer over the source/drain regions. The thickness of the first silicide layer over the gate regions is thicker than the second silicide layer over the source/drain junction regions due to the thin nitride layer.

In one embodiment of the invention, a first dielectric layer (gate dielectric) is formed on the surface of a semiconductor body and a polysilicon layer is formed over the first dielectric layer. A second dielectric layer is then formed over the polysilicon layer. The second dielectric layer and the polysilicon layer are etched to form a polysilicon gate having sidewall edges. Silicon nitride sidewall spacers are formed on the sidewall edges of the polysilicon gate. Source/drain junctions are formed in the surface of the semiconductor body adjacent the device sidewall spacers. The portion of the first dielectric layer located over the source/drain junctions is removed and replaced with a thin nitride layer. The second dielectric layer is then removed. A first silicide layer is formed over the polysilicon layer and a second silicide layer is formed over the source/drain junction regions. The first (gate) silicide layer is thicker than the second (source/drain) silicide layer.

An advantage of the invention is providing a self-aligned silicided process that allows for independent control of the gate silicide and the source/drain silicide thicknesses.

A further advantage of the invention is providing a self-aligned silicide process that enables controlled silicon consumption over the source/drain junctions without having to vary the react process parameter.

A further advantage of the invention is providing a self-aligned silicide process that is compatible with ultra-shallow source/drain junctions.

Other advantages will be apparent to those skilled in the art having reference to this specification together with the accompanying drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The self-aligned silicided process according to the invention will be described herein as incorporated into a n-channel insulated-gate field-effect transistor (IGFET) manufactured using a Complementary Metal-Oxide Semiconductor (CMOS) process. It should of course be understood that the self-aligned silicide process according to the invention may be incorporated into various types of transistors which are constructed according to MOS, BiCMOS, or CMOS technologies, each of which can utilize the benefits thereof. The concepts of this invention are also applicable to bipolar transistor technologies.

Figure 1:
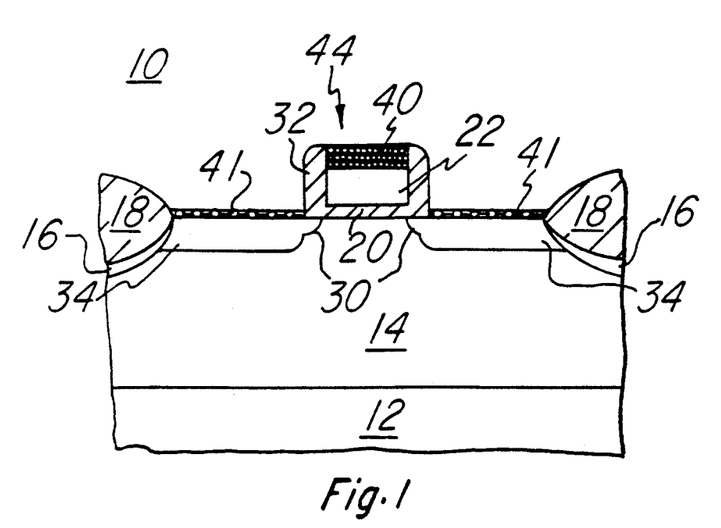
FIG. 1 is a cross-sectional diagram of a self-aligned silicided structure according to the preferred embodiment of the invention.

The self-aligned silicide structure of the preferred embodiment is shown in FIG. 1. Semiconductor body 10 includes a p-well 14 formed in substrate 12. Field insulating region 18 is located above optional channel stop regions 16 in p-well 14 and may typically comprise a silicon oxide material. It should be noted, however, that channel stop regions 16 are optional and need not be present to practice this invention. Formed within p-well 14 are source/drain junctions 34. Source/drain junctions 34 are n-type regions (for n-channel IGFETs) in the preferred embodiment. However, it will be apparent to those skilled in that art that source/drain junctions 34 may instead be p-type regions located in an n-well to form a p-channel transistor. An advantage of the invention is that source/drain junctions 34 may be shallow because the amount of silicon consumption can be controlled without sacrificing IGFET gate conductivity. Accordingly, the problems associated with short channel effects are reduced.

Silicided gate 44 is separated from the surface of p-well 14 by gate dielectric layer 20 and contains a silicide layer 40 and a doped polysilicon layer 22. Silicide layer 40 may be thicker than in prior art silicidation processes because the thickness of gate silicide layer 40 is not limited by the amount of silicon that may tolerably be consumed in forming silicide 41 over source/drain junctions 34. Sidewall spacers 32 insulate the vertical edges of gate 44 and separate the junction silicide 41 from IGFET channel region. Sidewall spacers 32 comprise silicon nitride in the preferred embodiment (although polysilicon may also be used).

Figure 2A:
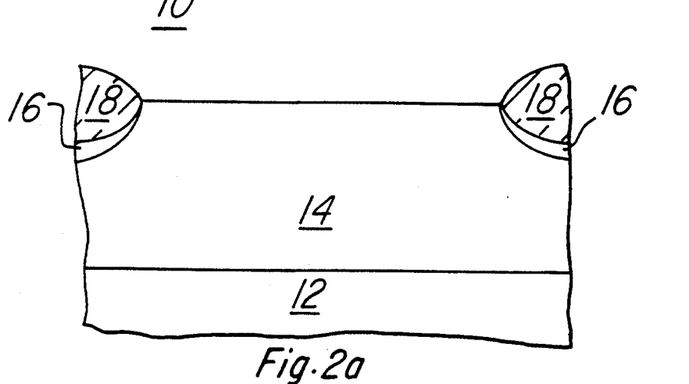
FIGS. 2a, 2b, 2c, 2d, 2e, 2f, 2g, 2h and 2i are cross-section views of the preferred embodiment of the invention at various fabrication steps.

FIG. 2a is a cross-sectional diagram of a semiconductor body 10 having a silicon substrate 12 after the formation of p-well 14, channel stop regions 16, and field insulating region 18. The formation of a self-aligned silicided gate in the structure of FIG. 2a will now be described.

Figure 2B:
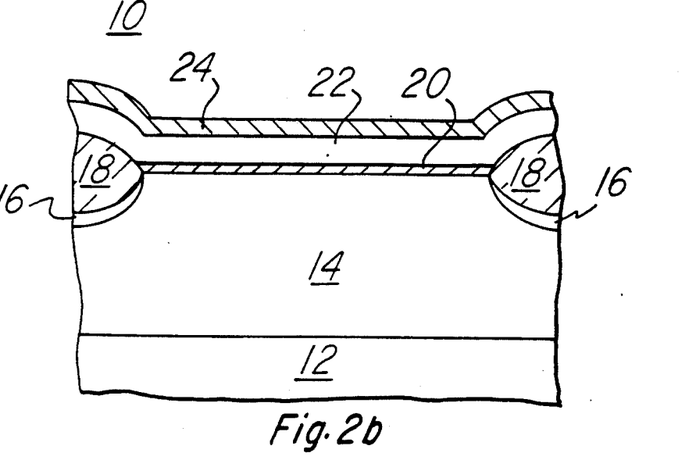
Figure 2C:
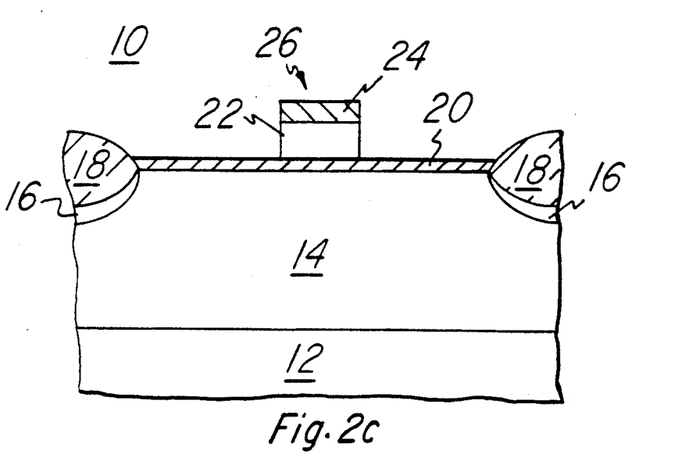

Referring to FIG. 2b, a gate dielectric layer 20 is thermally grown (e.g., by oxidation) on the surface of p-well 14 to a thickness on the order of 30–300 Å (for example, 60 Å for 0.25 $\mu$m technologies). Other methods of forming gate dielectric layer 20, such as oxide deposition, will be apparent to those skilled in the art. Polysilicon layer 22 is then deposited over gate dielectric layer 20 to a thickness on the order of 2000–4000 Å by chemical-vapor deposition (CVD) techniques. A dielectric layer 24 is deposited on polysilicon layer 22, for example by low pressure chemical-vapor deposition (LPCVD), to a thickness on the order of 200–1000 Å. Other methods of depositing dielectric layer 24, such as plasma-enchanced chemical-vapor deposition (PECVD), will be apparent to those skilled in the art. The disposable dielectric layer 24 and polysilicon layer 22 are then pattern by microlithography and anisotropic plasma etching to form polysilicon gate structure 26, as shown in FIG. 2c. Methods for such an etch are well known in the art.

Figure 2D:
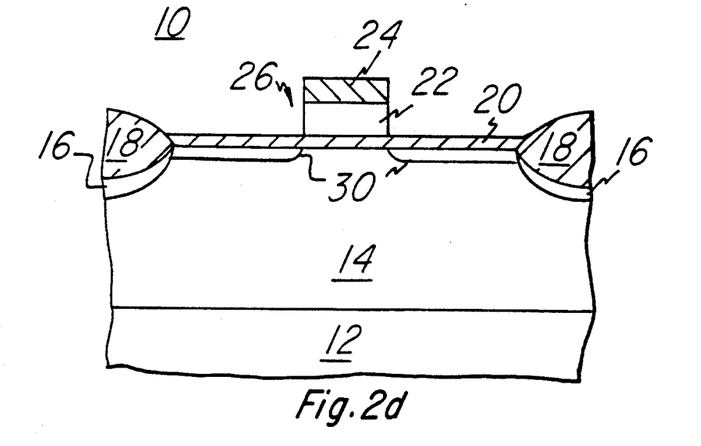
Figure 2E:
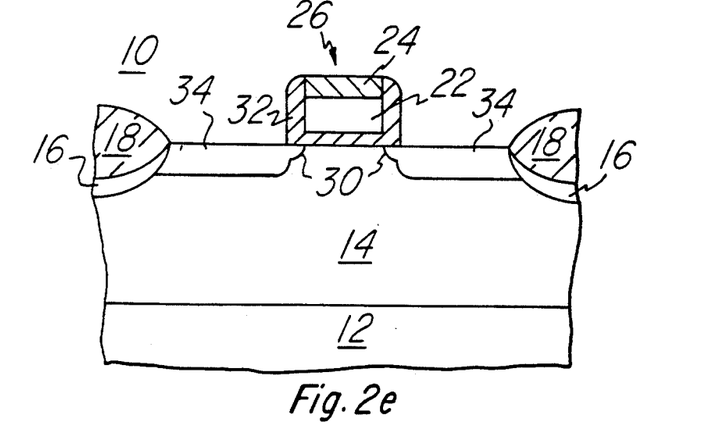

Referring to FIG. 2d, lightly doped drain (LDD) junctions 30 may optionally be formed now, by ion implantation. LDD junctions 30 will be self-aligned with the polysilicon gate structure 26 and field insulating region 18. The LDD junctions 30 may also be formed by ion implantation after formation of a first dielectric spacer (not shown). Referring to FIG. 2e, sidewall spacers 32 may now be formed by conventional techniques. For example, a layer of silicon nitride may be deposited and anisotropically etched to form sidewall spacers 32. An optional oxidation step may then be performed to grow a thin (50–100 Å) oxide (not shown) over source/drain regions. Source/drain junctions 34 are then formed (e.g., by implantation of phosphorus and/or arsenic) after which the grown optional thin oxide (not shown) is removed by a selective timed oxide etch. Source/drain junctions 34 are self-aligned with sidewall spacers 32 and field insulting regions 18.

Figure 2F:
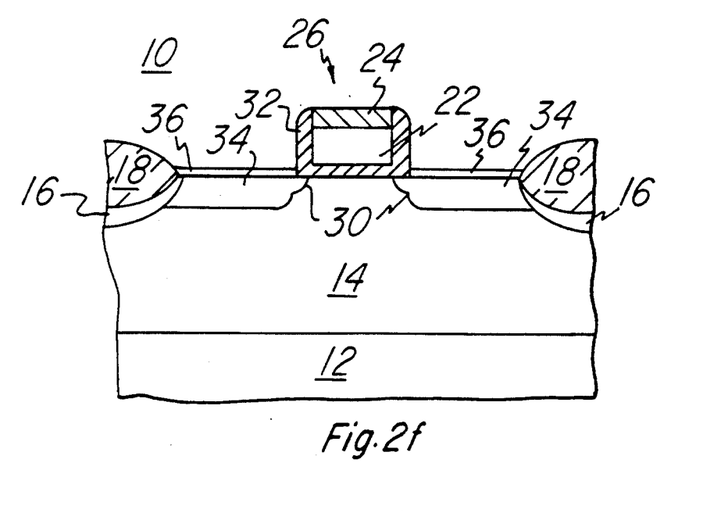

The following process steps are preferably performed using a vacuum-integrated cluster tool. Referring to FIG. 2f, any native oxide layer located over source/drain regions 34 is removed by, for example, using an in-situ vapor-phase HF or low temperature germane clean. Next, an ultra-thin (e.g., 8–40 Å) thermal nitride layer 36 is grown over the source/drain regions. Nitride layer 36 may be formed by a short rapid thermal nitridation (RTN) in an ammonia atmosphere and at a temperature of 700°–1000° C. for 15–200 seconds. The preferred embodiment uses an RTN at 700°–900° C. for less than 60 seconds. Nitride layer 36 will have a thickness on the order of 5–20 Å. It should be noted that no dense nitride will form on the surface of the polysilicon gate structure 26 due to the presence of oxide layer 24.

Figure 2G:
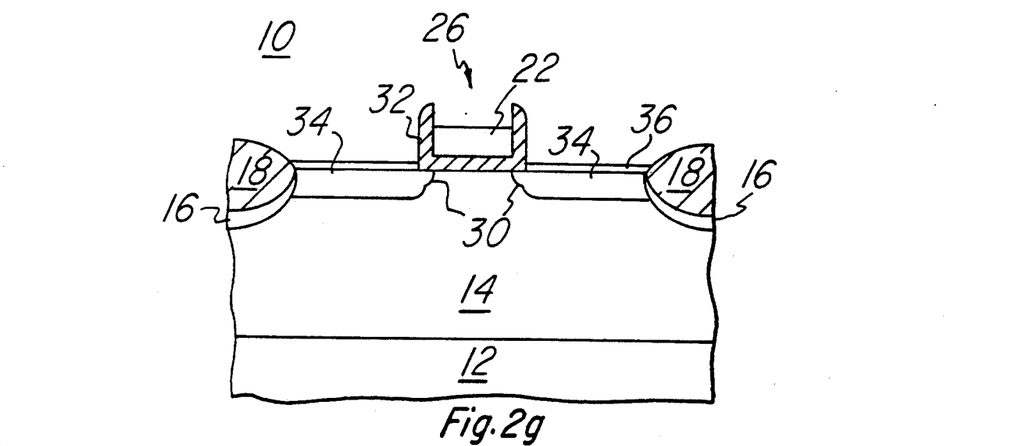

Referring to FIG. 2g, oxide layer 24 is removed by, for example, a vapor phase HF selective etch. The etch must be selective so as not to remove nitride layer 36. As a result, silicon nitride sidewall spacer 32 will also not be etched. The thermal nitride layer 36 is very dense and relatively hard to etch with an HF-based oxide removal process.

Figure 2H:
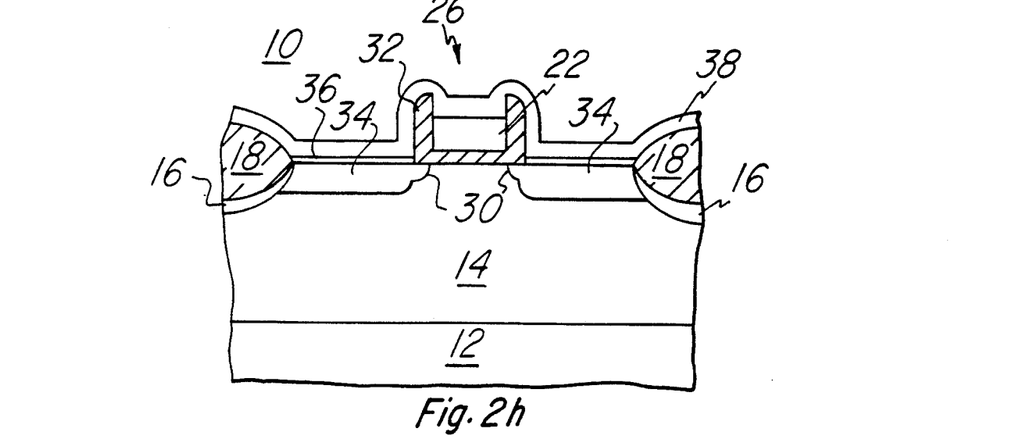
Figure 2I:
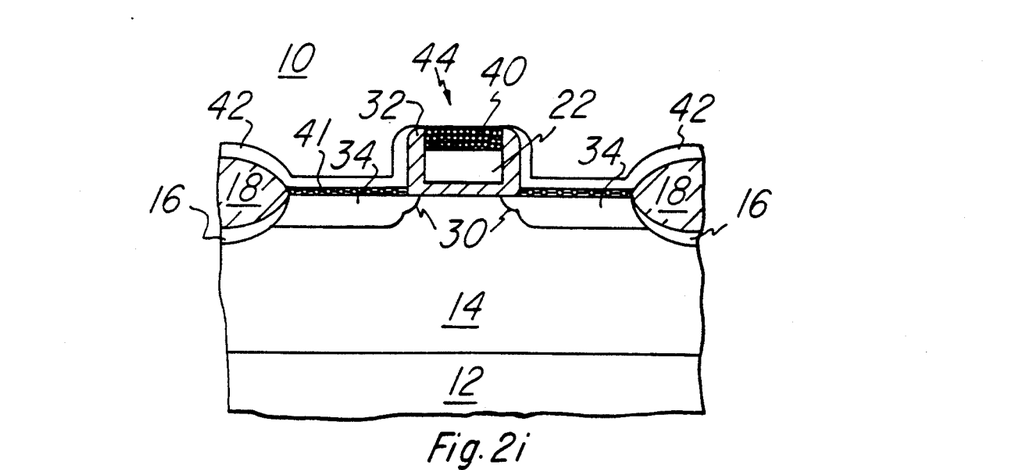

A refractory metal layer 38, such as titanium or cobalt, is then deposited using a sputter deposition on the surface of semiconductor body 10, as shown in FIG. 2h. Titanium is used in the preferred embodiment. Referring to FIG. 2i, a self-aligned silicide or "SALICIDE" process is performed which involves using a rapid thermal anneal or furnace anneal, in a nitrogen-containing atmosphere. It will be obvious to those skilled in the art that an atmosphere of ammonia ($NH_3$) may be used. Silicide is formed by the reaction of refractory metal layer 38 with silicon. Where no silicon is present, the refractory metal layer 38 reacts with the nitrogen atmosphere to form titanium-nitride (TiN). Because of the ultra-thin nitride layer 36 over source/drain junctions 34, a larger fraction of refractory metal layer 38 is nitridized (rather than silicided) over the source/drain junctions. The reaction of titanium with nitride layer 36 is slow but will eventually break through to form thin silicide layer 41 over source/drain junctions 34 with small amount of silicon consumption. The nitride layer 36 will only introduce nitrogen into the silicide reaction which is much preferred over oxide contamination. As a result, the silicide source/drain junction will have low resistivity and a smoother silicide/silicon interface that prior art techniques. The reaction of refractory metal layer 38 with polysilicon gate structure 26 forms a layer of silicide 40 to complete the formation of silicided gate 44. The layer of titanium-nitride (TiN) 42 is formed during the SALICIDE process over field insulating region 18 and silicided source/drain regions 34. Some unreacted titanium (not shown) may also remain on these surfaces. Finally, TiN layer 42, as well as any unreacted titanium, is removed using a selective etch such as a megasonic etch.

Figure 3A:
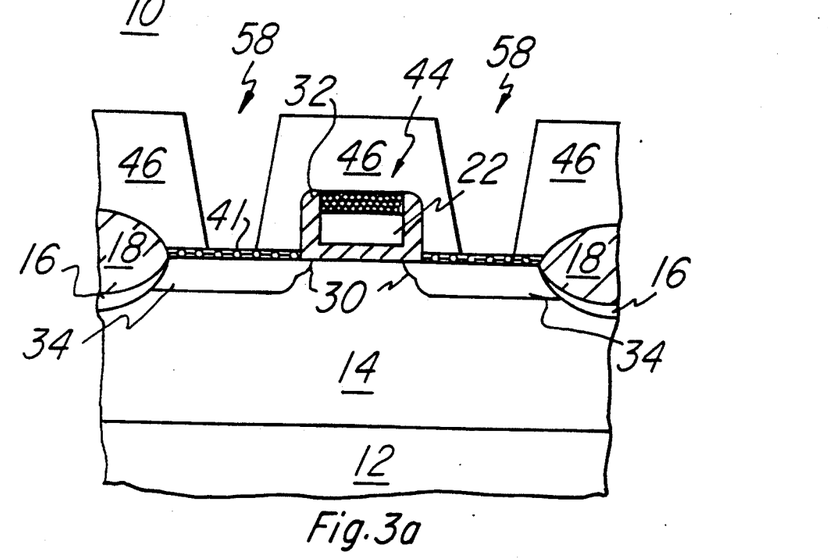
FIGS. 3a, 3b, 3c, 3d are cross-sectional views of the preferred embodiment of the invention including device contacts and interconnections at various fabrication steps.
Figure 3B:
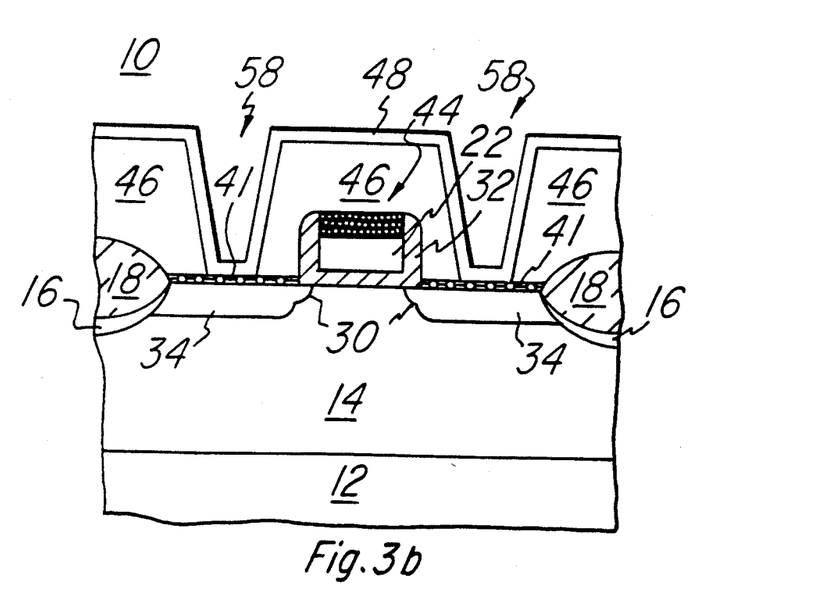
Figure 3C:
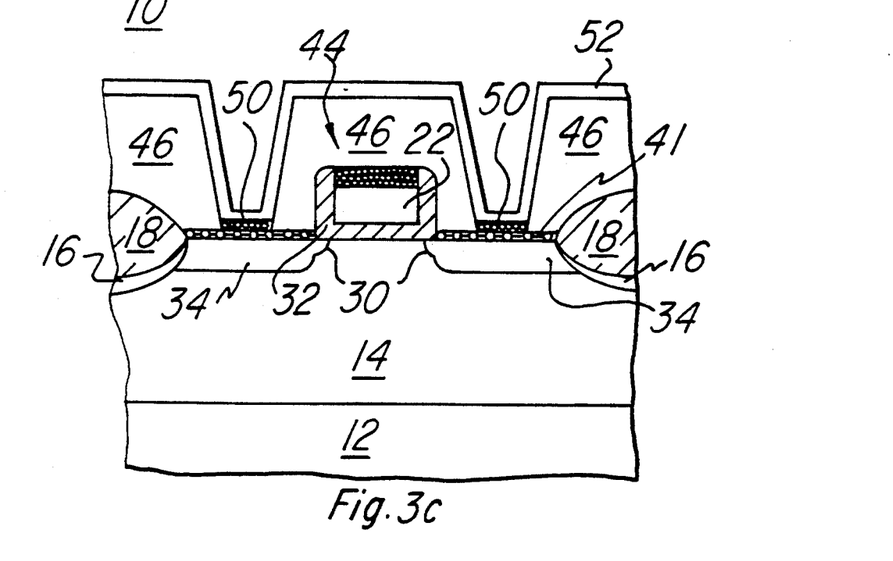
Figure 3D:
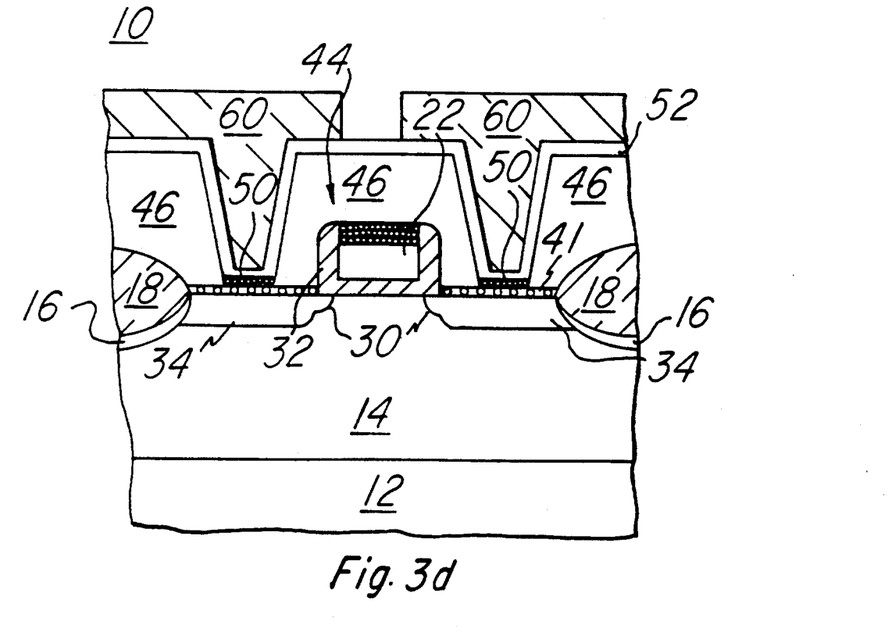

Subsequent to the completion of the method described above, interconnections between gate and source/drain junctions 34 and other elements (not shown) may be formed into semiconductor body 10. For example, an interlevel dielectric layer 46 may be deposited on the surface of semiconductor body 10, as shown in FIG. 3a. Contact holes 58 are then etched into interlevel dielectric layer 46 in order to make contact to silicided source/drain junctions 34. While etching contact holes 58, some portion of the silicided over source/drain junctions 34 may also be etched away. Accordingly, a silicided contact may be desired. A layer of refractory metal 48, such as titanium, may be deposited over the surface, as shown in FIG. 3b. Referring to FIG. 3c, a silicide react is performed as described above to form silicide contacts 50 on the surfaces of source/drain junctions 34 and TiN 52 elsewhere. Because not all of the refractory metal layer 48 reacts with source/drain junctions 34, silicide contacts 50 comprise a layer of silicide and a layer of TiN. Finally, referring to FIG. 3d, a layer of conductive material 60, such as aluminum, is deposited over the surface of the semiconductor body 10 and patterned and etched to form interconnections between source/drain junctions 34 and other devices (not shown).

Subsequent to the methods described above, other elements as well as connections therebetween may be formed into semiconductor body 10. Method for accomplishing this are well known in the art. Individual circuits are then separated from portions of substrate 12 and external connections made thereto by way of wire bonding, direct bump bonding, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments, Inc.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A self-aligned silicide process to form different thicknesses of silicide over source/drain junction regions and gate regions, comprising the steps of:
   a. forming a thin nitride layer on said source/drain regions;
   b. depositing a layer of refractory metal over said thin nitride layer and said gate regions; and
   c. annealing said layer of refractory metal to form a first silicide layer of a first thickness over said gate regions and a second silicide layer over said source/drain regions having a second thickness, wherein said first thickness is greater than said second thickness.

2. A self-aligned silicide process comprising the steps of:
   a. forming a gate dielectric on the surface of a semiconductor body;
   b. forming a polysilicon layer on the surface of said gate dielectric;
   c. forming a dielectric capping layer on said polysilicon layer;
   d. etching said dielectric capping layer and said polysilicon layer to form a polysilicon gate having sidewall edges;
   e. forming silicon nitride sidewall spacers on said sidewall edges;
   f. forming source/drain junctions in said surface of said semiconductor body adjacent said silicon nitride sidewall spacers;
   g. removing a first portion of said gate dielectric, said first portion located over said source/drain junctions;
   h. forming a thin nitride layer over said source/drain junctions;
   i. removing said dielectric capping layer; and
   j. forming a first silicide layer over said polysilicon layer and a second silicide layer over said source/drain regions, wherein said first silicide layer is thicker than said second silicide layer.

3. The process of claim 2, wherein said step of forming said first and second silicide layer comprises the steps of:
   a. depositing a first layer of refractory metal over said thin nitride layer, said nitride sidewall spacers and said polysilicon gate;
   b. annealing said first layer of refractory metal in a nitrogen-containing atmosphere to form said first layer of silicide over said polysilicon gate, said second layer of silicide over said source/drain regions, and a first layer of refractory metal-nitride over said second layer of silicide and said nitride sidewall spacers, wherein said first silicide layer is thicker than said second silicide layer; and
   c. removing said first layer of refractory metal-nitride.

4. The method of claim 3, wherein said first layer of refractory metal comprises titanium.

5. The method of claim 2, wherein said first and second silicide layers are formed in a single silicidation reaction step.

6. The method of claim 2, wherein said step of forming said dielectric capping layer comprises the step of depositing a LPCVD oxide layer having a thickness in the range of 200 to 500 Å.

7. The method of claim 2, further comprising the step of forming lightly doped drains prior to said step of forming said silicon nitride sidewall spacers.

8. The method of claim 2, wherein said step of forming said thin nitride layer comprises the step of rapid thermal nitridation in an ammonia atmosphere at 700°–1000° C. for 15–200 seconds.

9. The method of claim 2, wherein said thin nitride layer has a thickness in the range of 5–20 Å.

10. The method of claim 2, further comprising the steps of:
   a. forming an interlevel dielectric layer over said semiconductor body after said step of forming said first and second silicide layers;
   b. etching a portion of said interlevel dielectric layer over said source/drain junctions;
   c. forming silicide contacts over said source/drain junctions, respectively; and d. forming a plurality of interconnect lines to connect to said silicide contact.

11. The method of claim 10, wherein said step of forming said silicide contacts comprises:
   a. depositing a second layer of refractory metal over said interlevel dielectric layer and said source/drain junctions; and
   b. annealing said second layer of refractory metal in a nitrogen-containing atmosphere to form a third layer of silicide over said source/drain junctions and a second layer of titanium-nitride over said interlevel dielectric layer.

12. A self-aligned silicide process comprising the steps of:
   a. growing a silicon dioxide layer on the surface of a semiconductor body;
   b. depositing a polysilicon layer on the surface of said first dielectric layer;
   c. depositing a LPCVD oxide layer having a thickness in the range of 200 to 500 Å over said polysilicon layer;
   d. etching said LPCVD oxide layer and said polysilicon layer to form a polysilicon gate having sidewall edges;
   e. forming lightly doped drains in said surface of said semiconductor body adjacent said polysilicon gate;
   f. forming silicon nitride sidewall spacers on said sidewall edges;
   g. forming source/drain junction regions in said surface of said semiconductor body adjacent said silicon nitride sidewall spacers;
   h. selectively etching a first portion of said silicon dioxide layer, said first portion located over said source/drain junction regions;
   i. thermally growing a thin nitride layer having a thickness in the range 5–20 Å over said source/drain junction regions;
   j. removing said LPCVD oxide layer;
   k. depositing a first layer of refractory metal over said thin nitride layer, said silicon nitride sidewall spacers and said polysilicon gate;
   l. annealing said first layer of refractory metal in a nitrogen-containing atmosphere to form a first layer of silicide over said polysilicon gate, a second layer of silicide over said source/drain regions, and a first layer of refractory metal-nitride over said second layer of silicide and said silicon nitride sidewall spacers, wherein said first silicide layer is thicker than said second silicide layer;
   m. removing said first layer of refractory metal-nitride.

13. The method of claim 12, wherein said first layer of refractory metal comprises titanium.

14. The method of claim 12, wherein said step of forming said thin nitride layer comprises the step of rapid thermal nitridation in an ammonia atmosphere at 700°–1000° C. for 15–200 seconds.

15. The method of claim 12, further comprising the steps of:
   a. forming an interlevel dielectric layer over said semiconductor body after said step of forming said first and second silicide layers;
   b. etching a portion of said interlevel dielectric layer over said source/drain junction regions;
   c. forming silicide contacts over said source/drain junction regions, respectively; and
   d. forming a plurality of interconnect lines to connect to said silicide contacts.

* * * * *